(12) United States Patent
Skreen

(10) Patent No.: US 11,929,133 B2
(45) Date of Patent: Mar. 12, 2024

(54) METHODS FOR RECOVERY FOR MEMORY SYSTEMS AND MEMORY SYSTEMS EMPLOYING THE SAME

(71) Applicant: Micron Technology, Inc., Boise, ID (US)

(72) Inventor: Rachael Skreen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 247 days.

(21) Appl. No.: 17/571,319

(22) Filed: Jan. 7, 2022

(65) Prior Publication Data

US 2023/0223094 A1  Jul. 13, 2023

(51) Int. Cl.
  *G11C 7/00* (2006.01)
  *G11C 29/12* (2006.01)
  *G11C 29/38* (2006.01)

(52) U.S. Cl.
  CPC .......... *G11C 29/38* (2013.01); *G11C 29/1201* (2013.01); *G11C 29/12015* (2013.01)

(58) Field of Classification Search
  CPC ....... G11C 7/1006; G11C 7/22; G11C 7/1051; G11C 7/1078; G11C 8/04
  USPC .......................................... 365/189.12, 225.7
  See application file for complete search history.

(56) References Cited

U.S. PATENT DOCUMENTS

| | | | |
|---|---|---|---|
| 2010/0217927 A1* | 8/2010 | Song | G06F 3/0656 711/E12.001 |
| 2021/0103517 A1* | 4/2021 | Kim | G06F 11/1068 |

\* cited by examiner

Primary Examiner — Son T Dinh
(74) Attorney, Agent, or Firm — Perkins Coie LLP

(57) ABSTRACT

An apparatus is provided, comprising a controller, a plurality of memory devices operably connected to the controller, circuitry configured to measure a performance metric for each of the plurality of memory devices, and circuitry configured to select, based upon the measured performance metric, a subset of the plurality of memory devices to disable in response to a recovery command. Information corresponding to the selected subset cam be stored in a mode register of the apparatus, and the apparatus can further comprise circuitry configured, in response to a recovery command, to disable the subset of the plurality of memory devices.

20 Claims, 5 Drawing Sheets

METHODS FOR RECOVERY FOR MEMORY SYSTEMS AND MEMORY SYSTEMS EMPLOYING THE SAME

TECHNICAL FIELD

The present disclosure generally relates to memory systems, and more particularly relates to methods for recovery for memory systems and memory systems employing the same.

BACKGROUND

Memory devices are widely used to store information related to various electronic devices such as computers, wireless communication devices, cameras, digital displays, and the like. Information is stored by programing different states of a memory cell. Various types of memory devices exist, including magnetic hard disks, random access memory (RAM), read only memory (ROM), static RAM (SRAM), dynamic RAM (DRAM), synchronous dynamic RAM (SDRAM), and others. Memory devices may be volatile or non-volatile. Improving memory devices, generally, may include increasing memory cell density, increasing read/write speeds or otherwise reducing operational latency, increasing reliability, increasing data retention, reducing power consumption, or reducing manufacturing costs, among other metrics.

DETAILED DESCRIPTION

Due to manufacturing variation, memory devices that are packaged together in a stack or on a module may have vastly different drive strengths. This mismatch in drive strength can result in package or module failures, especially for packages and modules with limited capability to modify or align internal data speeds. When such a failure occurs, the package or module can be "recovered" by disabling a subset of the memory devices to reduce a total memory density/memory capacity of the package or module. Without information about which devices have well-matched drive strengths, conventional recovery operations may fail to provide a working package or module, even after disabling a subset of the dies. Even where, through good fortune, a working package or module is produced by the recovery operation, the mismatch of drive strengths in the remaining devices can still negatively impact performance, even if not to a level that qualifies as a failure.

Accordingly, several embodiments of the present technology are directed to memory devices, systems including memory devices, and methods of operating memory devices and systems in which the drive strengths or other performance characteristics of memory devices in a package, module, or other memory system can be measured (e.g., by counting a number of oscillations generated by each memory device over a predetermined period) and information corresponding to these measured performance characteristics can be either be stored in anticipation of a possible recovery command, or generated in response to a recovery command, such that the subset of memory devices selected for disablement can be those with the most poorly-matched drive strength. As a result, the post-recovery memory system retains the functionality of those memory devices with the best-matched drive strengths, for improved overall performance.

Figure 1:
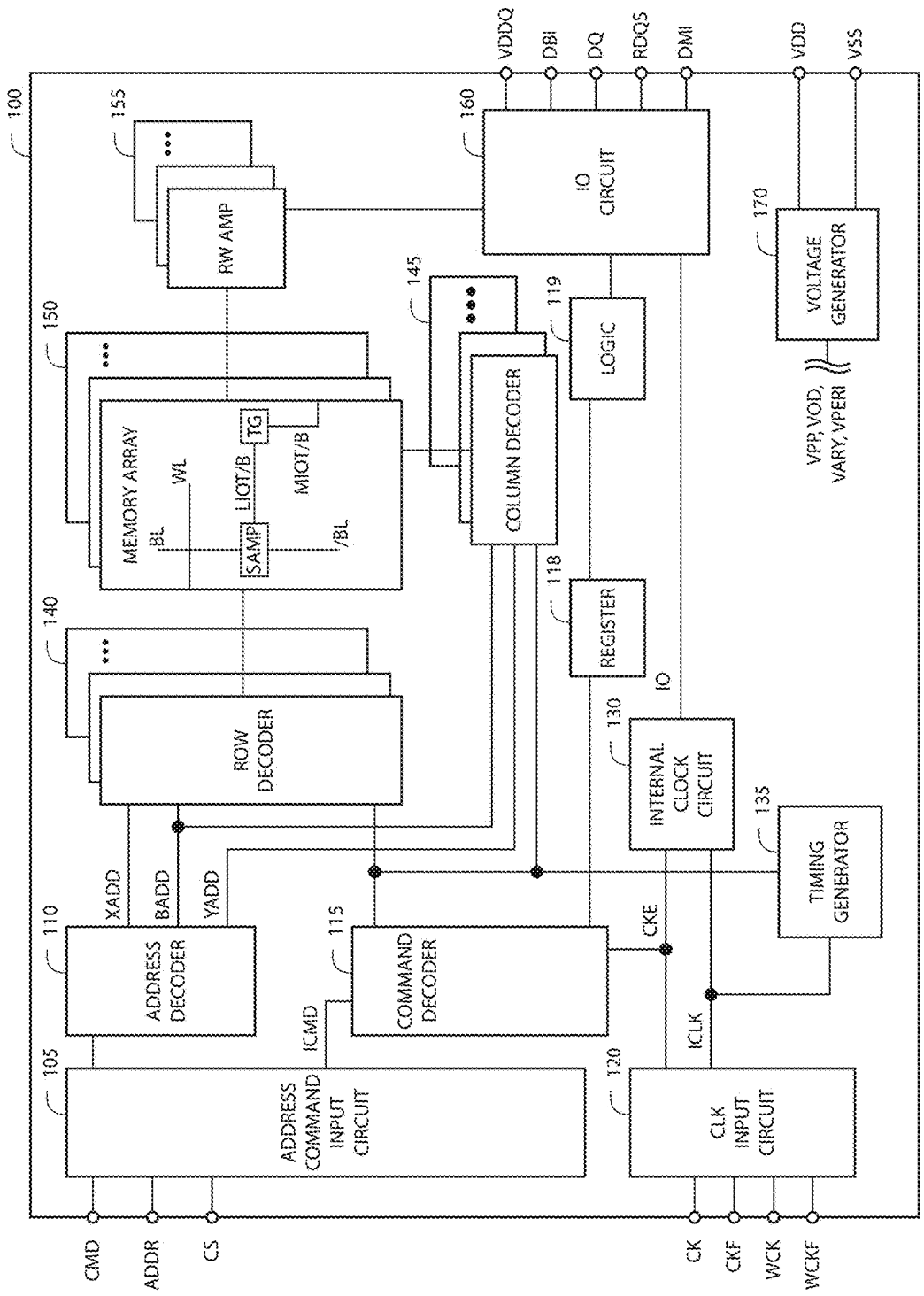
FIG. 1 is a simplified block diagram schematically illustrating a memory device in accordance with an embodiment of the present technology.

FIG. 1 is a block diagram schematically illustrating a memory device 100 in accordance with an embodiment of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells arranged at intersections of the word lines and the bit lines. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ, and on-die termination terminal(s) ODT.

The command terminals and address terminals may be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals may be supplied with command signals CMD, address signals ADDR, and chip selection signals CS, from a memory controller. The command signals may represent various memory commands from the memory controller (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK.

When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When a write command is issued and a row address and a column address are timely supplied with the command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (not shown in FIG. 1). The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The on-die termination terminal(s) may be supplied with an on-die termination signal ODT. The on-die termination signal ODT can be supplied to the input/output circuit 160 to instruct the memory device 100 to enter an on-die termination mode (e.g., to provide one of a predetermined number of impedance levels at one or more of the other terminals of the memory device 100).

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

The memory device 100 may further include one or more registers 118 for storing various data (e.g., device status information). Mode registers 118 may include read-only bits, read-write bits, write-only bits, or any combination thereof. In some embodiments, mode registers 118 may be arranged in byte-sized addressable portions, with each individually-addressable mode register containing 8 bits. The read-write and write-only mode register bits may be written in response to mode register write (MRW) commands in which the data to be written is provided over the CA interface, and the read-write and read-only mode register bits may be read from in response to mode register read (MRR) commands in which the stored data output through the DQ data terminals. The mode registers 118 may also be read and written internally by various components of the memory device 100 (e.g., populating read-only mode register bits with device status information, determining a status of a write-only mode register bit, etc.), but without exchanging data with a terminal of the memory device. The memory device 100 may further include logic 119 for counting, comparing, and selecting values, as described in greater detail below.

Figure 2:
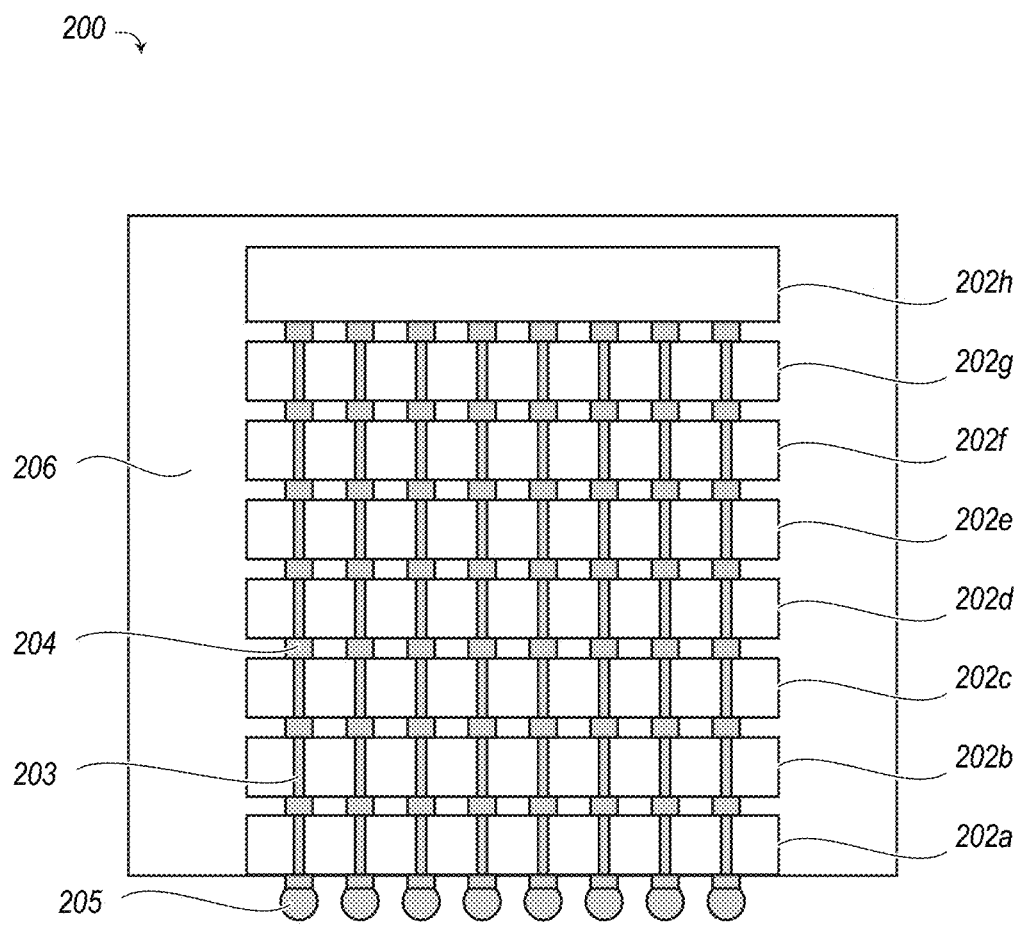
FIG. 2 through 4 are simplified block diagrams schematically illustrating memory systems in accordance with various embodiments of the present technology.

According to one embodiment of the present disclosure, a memory device such as memory device 100 can be incorporated into a larger memory system, together with other similar memory devices and, optionally, a logic device or controller. FIG. 2 is a simplified block diagram schematically illustrating one such memory system 200 in accordance with an embodiment of the present technology. Memory system 200 includes a controller device 202a on which is carried a stack of memory devices 202b-202h. According to one aspect of the present disclosure, controller device 202a could be a first memory device of the plurality of memory devices in the memory system 200 (i.e., controller device 202a could be a "master" memory device and the remaining memory devices in the memory system 200 could be corresponding "slave" memory devices). As illustrated in FIG. 2, the total number of memory devices in the memory system 200 can be a power of 2 (e.g., 2, 4, 8, 16, 32, etc.), such as the eight memory devices 202a-202h illustrated in FIG. 2. Controller device 202a and memory devices 202b-202g include through-silicon vias (TSVs) 203, which permit the memory devices 202b-202h to be stacked vertically and operably coupled to each other and to the controller 202a by corresponding interconnects 204. In some embodiments, as illustrated in FIG. 2, an uppermost memory device in a vertical stack of memory devices can omit the TSVs 203, as the absence of any additional device overlying the top of the stack obviates them. Memory system 200 can further include external contacts 205 for communicating with higher-level systems (e.g., a system board or mother board in a computing system incorporating memory system 200). Memory system 200 can further include an encapsulant (e.g., of mold material or the like) surrounding the memory devices 202b-202h and the controller 202a to mechanically and electrically protect them. Although not illustrated, memory system 200 can optionally include a substrate on which the controller device 202a and memory devices 202b-202h are carried and through which the controller device 202a and memory devices 202b-202h communicate to the external contacts 205.

As set forth above, due to manufacturing variations (or other potential causes, to which embodiments of the present disclosure have equally valuable application), the drive strengths of controller 202a and memory devices 202b-202h can vary. The varying drive strengths can contribute to faster or slower internal data and/or command speeds. Where these speeds are mismatched by too wide a margin, failures can occur (e.g., where data arrives too slowly from one device in the system such that data capture is missed). This can be especially challenging in systems designed to operate at higher speeds (e.g., DDR5 DRAM operating at or above 6400 MHz). To address this kind of failure (and others based on other performance characteristics), embodiments of the present disclosure can exploit a modified die recovery operation for systems with multiple memory devices to disable a subset of the memory devices 202b-202g in the memory system 200 based upon how their measured internal drive strengths compare to each other and/or to that of the controller 202a.

For example, in the embodiment illustrated in FIG. 2 in which the controller device 202a is a first memory device (e.g., a "master" device), controller device 202a can include counting logic configured to count a number of oscillations received from an oscillator in each of the memory devices 202a-202g over a predetermined period (e.g., from a counting start command until a counting stop command, or for a fixed number of external clock cycles following a counting start command, etc.), and to compare the counts for each memory device 202b-202h with an internally-generated count of the controller device 202a in order to determine which of the memory devices 202b-202h have a drive strength that diverges by the largest amount from the drive strength of the controller device 202a. The determined count for each device can be stored in a mode register for later retrieval (e.g., in response to a recovery command). The counts for all of the devices can be stored in one or more mode registers of the controller device 201, and/or the counts for each device can be stored in a mode register of the corresponding device. In other embodiments, other storage locations than mode registers could be used for storing the count or a representation thereof (e.g., a difference in the count of each device from the count of the controller device 201, or a divergence of the count of each device from a mean of the counts of all the devices, etc.), such as a reserved portion of a memory array of one or more of the devices in the memory system 200, a dedicated memory storage component in the memory device (not illustrated), such as a EEPROM, nonvolatile memory, or the like.

According to one aspect of the present disclosure, by measuring the internal drive speed of each memory device in the memory system 200 and storing them for later retrieval, memory system 200 can respond to a recovery command (e.g., which disables a subset of the memory devices in the memory system 200 following the failure of one or more of the memory devices) by disabling not a predetermined or randomly-selected subset of the memory devices 202b-202h, but by disabling a subset of the memory devices 202b-202h which have drive strengths which diverge by the widest margin from the drive strength of the controller device 202a (e.g., when the controller device 201 is a first or master memory device) or from the average drive strength of all the memory devices, or at least those which are not failing for a reason other than drive strength mismatch.

Alternatively, in another embodiment, rather than storing the counts, or information regarding the counts (e.g., their divergence from a count of the controller device 202a or from a mean of all counts), in another embodiment the counts can be used by comparing logic (e.g., in the controller device 202a) to determine a subset of the memory devices 202a-202h that would be disabled in response to a recovery command, and to store information identifying that subset (e.g., in a mode register of the controller device 202a). For example, Table 1, below, shows exemplary value of a mode register that indicate which devices of an eight-memory-device assembly would be enabled and which would remain enabled for a variety of different recovery solutions, using only seven bits of information across two mode registers:

TABLE 1

| MR Number SSRecoveryVal<3:0> | | | | MR Number SSOption<2:0> | | | ENABLED (E) DIE NUMBER: | | | | | | | | Recovery Solution |
|---|---|---|---|---|---|---|---|---|---|---|---|---|---|---|---|
| <3> | <2> | <1> | <0> | <2> | <1> | <0> | CON | 2 | 3 | 4 | 5 | 6 | 7 | 8 | |
| 0 | 1 | 1 | 1 | 0 | 0 | 1 | E | E | E | E |   |   |   |   | 4H |
| 1 | 0 | 0 | 0 | 0 | 0 | 1 | E | E |   | E | E |   |   |   | 4H |
| 1 | 0 | 0 | 1 | 0 | 0 | 1 | E | E |   | E |   | E |   |   | 4H |
| 1 | 0 | 1 | 1 | 0 | 0 | 1 | E | E |   | E |   |   | E |   | 4H |
| 1 | 1 | 1 | 1 | 0 | 0 | 1 | E | E |   | E |   |   |   | E | 4H |
| 0 | 1 | 1 | 1 | 0 | 1 | 0 | E | E | E |   | E |   |   |   | 4H |
| 1 | 0 | 0 | 0 | 0 | 1 | 0 | E | E | E |   |   | E |   |   | 4H |
| 1 | 0 | 0 | 1 | 0 | 1 | 0 | E | E | E |   |   |   | E |   | 4H |
| 1 | 0 | 1 | 1 | 0 | 1 | 0 | E | E | E |   |   |   |   | E | 4H |
| 1 | 1 | 1 | 1 | 0 | 1 | 0 | E |   | E | E | E |   |   |   | 4H |
| 0 | 1 | 1 | 1 | 0 | 1 | 1 | E |   | E | E |   | E |   |   | 4H |
| 1 | 0 | 0 | 0 | 0 | 1 | 1 | E |   | E | E |   |   | E |   | 4H |
| 1 | 0 | 0 | 1 | 0 | 1 | 1 | E |   | E | E |   |   |   | E | 4H |
| 1 | 0 | 1 | 1 | 0 | 1 | 1 | E |   |   | E | E | E |   |   | 4H |
| 1 | 1 | 1 | 1 | 0 | 1 | 1 | E |   |   | E | E |   | E |   | 4H |
| 0 | 1 | 1 | 1 | 1 | 0 | 0 | E |   |   | E | E |   |   | E | 4H |
| 1 | 0 | 0 | 0 | 1 | 0 | 0 | E |   |   |   | E | E | E |   | 4H |
| 1 | 0 | 0 | 1 | 1 | 0 | 0 | E |   |   |   | E | E |   | E | 4H |
| 1 | 0 | 1 | 1 | 1 | 0 | 0 | E |   |   |   |   | E | E | E | 4H |
| 1 | 1 | 1 | 1 | 1 | 0 | 0 | E | E |   |   |   |   | E | E | 4H |
| 0 | 1 | 1 | 1 | 1 | 0 | 1 | E | E |   |   |   | E | E |   | 4H |
| 1 | 0 | 0 | 0 | 1 | 0 | 1 | E | E |   |   | E | E |   |   | 4H |
| 1 | 0 | 0 | 1 | 1 | 0 | 1 | E | E |   |   | E |   |   | E | 4H |
| 1 | 0 | 1 | 1 | 1 | 0 | 1 | E | E |   |   |   | E |   | E | 4H |
| 1 | 1 | 1 | 1 | 1 | 0 | 1 | E |   | E |   |   |   | E | E | 4H |
| 0 | 1 | 1 | 1 | 1 | 1 | 0 | E |   | E |   |   | E | E |   | 4H |
| 1 | 0 | 0 | 0 | 1 | 1 | 0 | E |   | E |   | E | E |   |   | 4H |
| 1 | 0 | 0 | 1 | 1 | 1 | 0 | E |   | E |   | E |   |   | E | 4H |
| 1 | 0 | 1 | 1 | 1 | 1 | 0 | E |   | E |   |   | E |   | E | 4H |
| 1 | 1 | 1 | 1 | 1 | 1 | 0 | E |   |   | E |   |   | E | E | 4H |
| 0 | 1 | 1 | 1 | 1 | 1 | 1 | E |   |   | E |   | E | E |   | 4H |
| 1 | 0 | 0 | 0 | 1 | 1 | 1 | E |   |   | E | E |   |   | E | 4H |
| 1 | 0 | 0 | 1 | 1 | 1 | 1 | E |   |   |   |   |   |   |   | 1H |

With the recovery solution pre-calculated based upon the comparison of internal drive strengths, memory system 200 can quickly implement a recovery operation by, e.g., blowing fuses connecting circuitry of the subset of dies selected for disablement in response to receiving a recovery command from a connected host device. In this regard, the circuitry disconnected in each memory device selected for disablement can be all of the circuitry, or in other embodiments, less than all of the circuitry of each device. For example, in the present example embodiment of FIG. 2, where one or more of the memory devices selected for disablement are positioned between two memory devices that will remain enabled in the TSV-connected stack, the circuitry in the one or more memory devices that is disabled may be exclusive of transmitter and receiver circuitry that permits signals to be communicated across the TSVs of the disabled memory devices from one enabled memory device to another. In other embodiments, where TSVs are not utilized to operably connect memory devices in a system (e.g., in a wire bond package, or a module with multiple direct chip attached (DCA) memory devices, etc.), all of the circuitry in a memory device selected for disablement may be disconnected from the memory system (e.g., by blowing fuses or the like).

Figure 3:
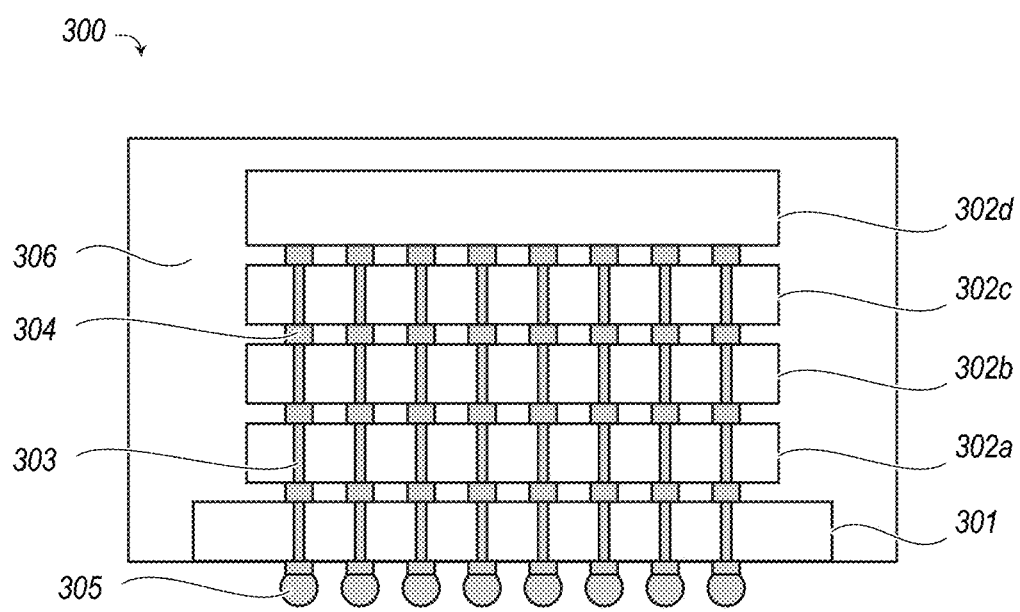

According to another aspect of the present disclosure, a memory system may include, rather than a controller device that is a master memory device, a separate logic device (e.g., a memory controller die, a logic die, etc.) configured to manage the memory devices in the memory system (e.g., a "high bandwidth memory" (HBM) device or a "hybrid memory cube" (HMC)). One such an arrangement is schematically illustrated in FIG. 3. As can be seen with reference to FIG. 3, the number of memory devices 302a-302d in the system is, like the memory system 200 illustrated in FIG. 2, a power of two (e.g., four), and an additional controller device 301 is provided in the system 300 to manage the memory devices 302a-302d. Controller device 301 and memory devices 302a-202g include through-silicon vias (TSVs) 303, which permit the memory devices 302b-302d to be stacked vertically and operably coupled to each other and to the controller 301 by corresponding interconnects 304. Memory system 300 can further include external contacts 305 for communicating with higher-level systems (e.g., a system board or mother board in a computing system incorporating memory system 300). Memory system 300 can further include an encapsulant (e.g., of mold material or the like) surrounding the memory devices 302a-302d and the controller 301 to mechanically and electrically protect them. Although not illustrated, memory system 300 can optionally include a substrate on which the controller device 301 and memory devices 302a-302d are carried and through which the controller device 301 and memory devices 302a-302d communicate to the external contacts 305. Additionally, although controller device 301 is illustrated as carrying a stack of memory devices 302a-302d, in other arrangements (e.g., 2.5D memory devices), controller device 301 may be laterally spaced apart from the stack of memory devices and mounted on a common interposer through which it can communicate with the memory devices.

Controller device 301 can include counting logic configured to count a number of oscillations received from an oscillator in each of the memory devices 302a-302d over a predetermined period (e.g., from a counting start command until a counting stop command, or for a fixed number of external clock cycles following a counting start command, etc.), and to compare the counts for each memory device 302a-302d in order to determine which of the memory devices 302a-302d have a drive strength that diverges by the largest amount from the drive strength of the other memory devices 302a-302d (e.g., by comparing the count of each memory device to a mean count, or determining a subset of half, fourth, etc. of the memory devices 302a-302d with the smallest deviation). The determined count for each device can be stored in a mode register for later retrieval (e.g., in response to a recovery command). The counts for all of the devices can be stored in one or more mode registers of the controller device 301, and/or the counts for each device can be stored in a mode register of the corresponding device. In other embodiments, other storage locations than mode registers could be used for storing the count or a representation thereof (e.g., a difference in the count of each device from the mean of the counts of all the devices, etc.), such as a reserved portion of a memory array of one or more of the devices in the memory system 300, a dedicated memory storage component in the memory device (not illustrated), such as a EEPROM, nonvolatile memory, or the like.

According to one aspect of the present disclosure, by measuring the internal drive speed of each memory device in the memory system 300 and storing them for later retrieval, memory system 300 can respond to a recovery command (e.g., which disables a subset of the memory devices in the memory system 300 following the failure of one or more of the memory devices) by disabling not a predetermined or randomly-selected subset of the memory devices 302a-302d, but by disabling a subset of the memory devices 302a-302d which have drive strengths which diverge by the widest margin from each other, or at least those which are not failing for a reason other than drive strength mismatch.

Alternatively, in another embodiment, rather than storing the counts, or information regarding the counts, in another embodiment the counts can be used by comparing logic (e.g., in the controller device 301) to determine a subset of the memory devices 302a-302d that would be disabled in response to a recovery command, and to store information identifying that subset. For example, Table 2, below, shows exemplary value of a mode register that indicate which two or three devices of a four-memory-device assembly would be disabled and which one (for a 1H recovery solution) or two (for a 2H recovery solution) would remain enabled, using only four bits of information in a single mode register:

TABLE 2

| MR Number SSRecoveryVal <3:0> | | | | ENABLED (E) DIE NUMBER: | | | | Recovery Solution |
| --- | --- | --- | --- | --- | --- | --- | --- | --- |
| <3> | <2> | <1> | <0> | 1 | 2 | 3 | 4 | |
| 0 | 0 | 0 | 0 | E | E | | | 2H |
| 0 | 0 | 0 | 1 | E | | E | | 2H |
| 0 | 0 | 1 | 1 | E | | | E | 2H |
| 0 | 1 | 1 | 1 | E | | | | 1H |
| 1 | 1 | 1 | 1 | | E | E | | 2H |
| 1 | 1 | 1 | 0 | | E | | E | 2H |
| 1 | 1 | 0 | 0 | | E | | | 1H |
| 1 | 0 | 0 | 0 | | | E | E | 2H |
| 1 | 0 | 0 | 1 | | | E | | 1H |
| 1 | 0 | 1 | 1 | | | | E | 1H |

As can be seen with reference to Tables 1 and 2, above, a recovery solution can involve disabling a subset of the n memory devices in a memory system such that the remaining number of enabled devices after the recovery operation is performed remains a power of two. In this regard, the subset of disabled device can comprise n−n/x of the n devices, where x is a power of two (e.g., for an eight-device system, the disabled subset can include four devices where x=2, or six devices where x=4, or seven devices where x=8; for a four-device system, the subset can include two or three devices, for a sixteen-device system, the subset can include 8, 12, 14, or 15 devices, etc.). Of course, as will be readily apparent to those of skill in the art, it may not be necessary to retain a number of enabled memory devices that equal a power of two, and the number of devices in the disabled subset can therefore vary from the above values.

Figure 4:
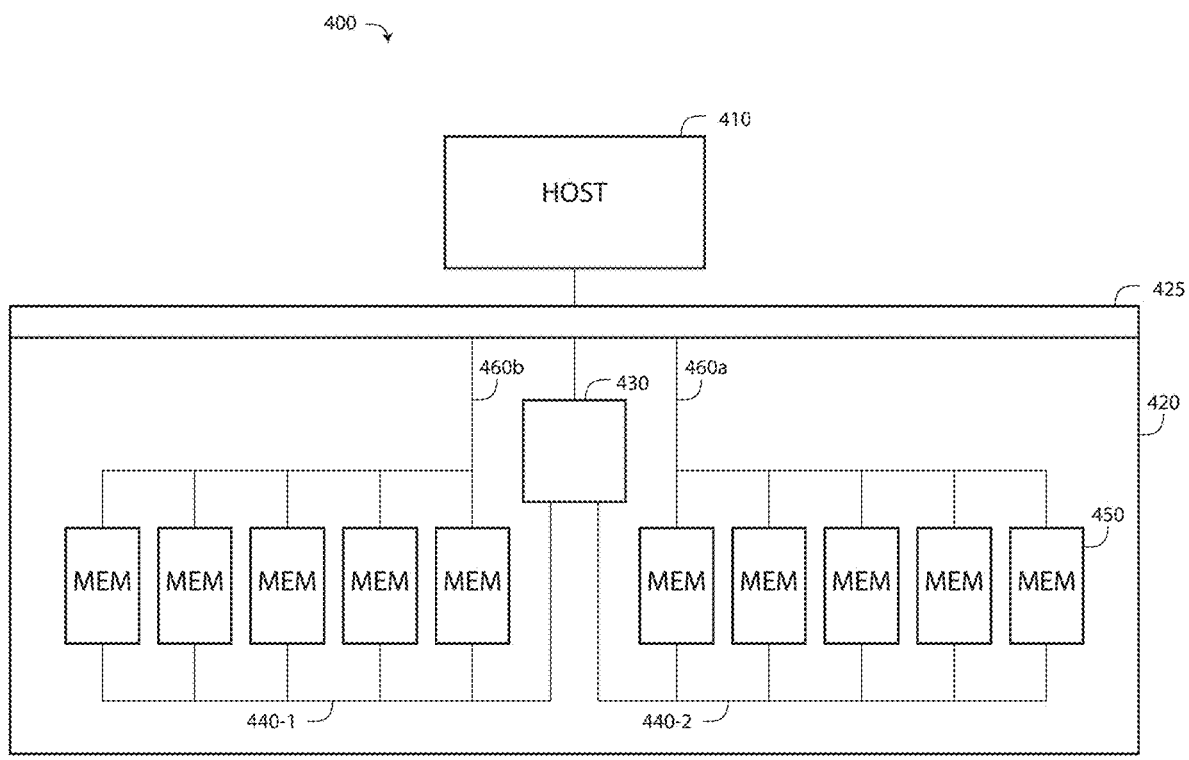

Turning to FIG. 4, a memory system including multiple memory devices, such as the memory device 100 of FIG. 1, is schematically illustrated in a simplified block diagram in accordance with an embodiment of the present technology. Memory system 400 includes a host device 410 operably coupled to a memory module 420 (e.g., a dual in-line memory module (DIMM)). Memory module 420 can include a connector 425 (e.g., an edge connector) operably coupled to the host device 410. Memory module 420 can further include a plurality of memory devices 450 operably coupled to the connector 425 by data lines, illustrated as being organized into data bus 460a and 460b. Memory module 420 can further include a memory controller 430 (e.g., or a registering clock driver (RCD)) operably coupled to both the connector 425 and the plurality of memory devices 450 by one or more command/address busses, such as C/A busses 440-1 and 440-2.

According to one embodiment, memory system 400 can be configured to perform a measurement operation of the plurality of memory devices 450 to determine the values for one or more performance metrics (e.g., drive strength, operating speed, etc.) for each of the memory devices 450, as set forth above with respect to FIGS. 2 and 3. Like the memory systems 200 and 300 illustrated above, memory system 400 includes a controller 430 that can be configured to perform the measurement, comparison, and determining functions described in greater detail above. Alternatively or additionally, one or more of these functions can be performed by the host device 410 in an embodiment in which end-user involvement (such as selecting the members of or the size of a subset) in the recovery operation is desirable. For example, the host device 410 can be configured to issue a counting command that triggers a counting operation for determining a number of oscillations over a predetermined time for one or more of the memory devices 450, to perform a comparison of the results of the counting operation(s), to determine a subset of memory devices 450 to be disabled in a recovery operation (e.g., automatically based on the comparison, or optionally based on user input in response to displaying the results of the comparison), and to issue a recovery command to trigger the recovery operation and to disable the selected subset. As set forth above, the disablement of the selected subset of memory devices 450 can involve disconnecting some or all of the circuitry thereof from the memory system 400, by way of fuses or other disconnection devices known to those of skill in the art.

Although in the foregoing example embodiments a subset of memory devices in a memory system has been illustrated and described as being disabled in response to a mismatch of drive strengths between members of the subset and other devices (memory devices and/or controllers) in the memory system, in other embodiments of the present disclosure, a subset of memory devices may be disabled in a recovery operation based upon other reasons, such as other defects of one or more of the memory devices, configuring a memory system for different capacities, etc. In still other embodiments, other performance metrics than drive strength or operating speed may be measured and compared to determine which memory devices will make up the subset to be disabled in a recovery operation. In this regard, in some embodiments, more than one performance metric may be measured for each device and compared to one or more thresholds (e.g., predetermined values, means of measured metrics, etc.) in making the determination of membership in the subset.

Figure 5:
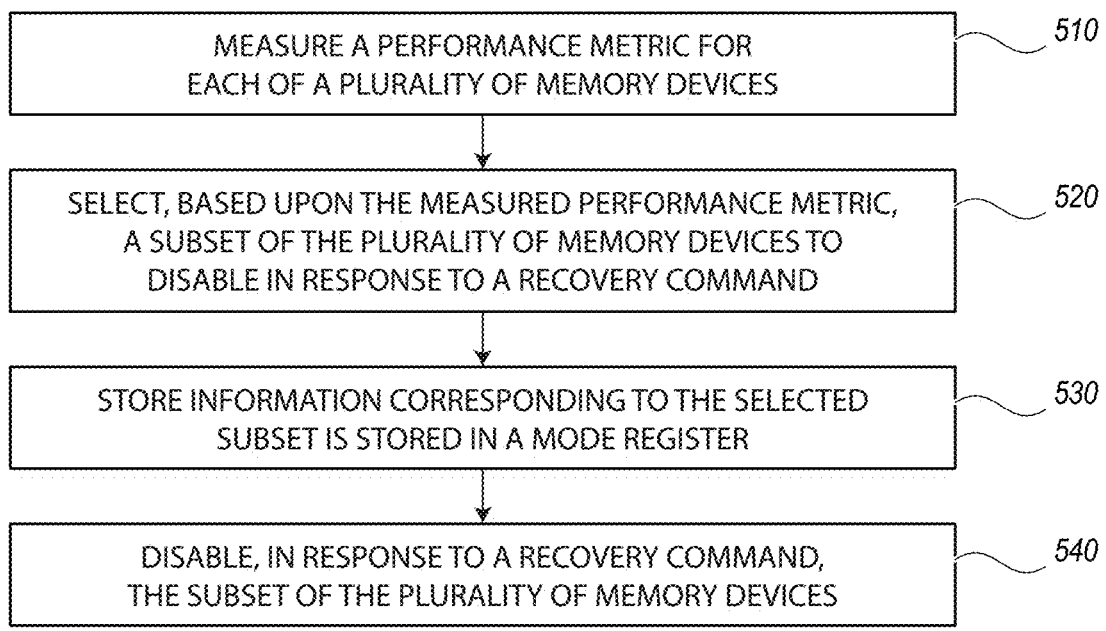
FIG. 5 is a flow chart illustrating a method of operating a memory system in accordance with an embodiment of the present technology.

FIG. 5 is a flow chart illustrating a method of operating a memory system (e.g., a memory module including one or more memory devices) in accordance with an embodiment of the present technology. The method includes measuring a performance metric for each of a plurality of memory devices (box 510). According to one aspect of the present disclosure, the measuring features of box 510 may be implemented with logic 119, controller 202a, controller 301, controller 430 or host 410, as illustrated in FIGS. 1 through 4 in greater detail, above. The method further includes selecting, based upon the measured performance metric, a subset of the plurality of memory devices to disable in response to a recovery command (box 520). According to one aspect of the present disclosure, the selecting features of box 520 may be implemented with logic 119, controller 202a, controller 301, controller 430 or host 410, as illustrated in FIGS. 1 through 4 in greater detail, above. The method further includes storing information corresponding to the selected subset is stored in a mode register (box 530). According to one aspect of the present disclosure, the storing features of box 530 may be implemented with mode register 118, as illustrated in FIG. 1 in greater detail, above. The method may further optionally include disabling, in response to a recovery command, the subset of the plurality of memory devices (box 540). According to a one aspect of the present disclosure, the disabling features of box 540 may be implemented with controller 202a, controller 301, controller 430 or host 410, as illustrated in FIGS. 2 through 4 in greater detail, above.

It should be noted that the methods described above describe possible implementations, and that the operations and the steps may be rearranged or otherwise modified and that other implementations are possible. Furthermore, embodiments from two or more of the methods may be combined.

Although in the foregoing example embodiments, memory modules and devices have been illustrated and described with respect to DRAM devices, embodiments of the present technology may have application to other memory technologies, including SRAM, SDRAM, NAND and/or NOR flash, phase change memory (PCM), magnetic RAM (MRAM), ferroelectric RAM (FeRAM), etc. Moreover, although memory modules have been illustrated and described as dual in-line memory modules (DIMMs) having nine memory devices, embodiments of the disclosure may include more or fewer memory devices, and/or involve other memory module or package formats (e.g., single in-line memory modules (SIMMs), small outline DIMMS (SODIMMs), single in-line pin packages (SIPPs), custom memory packages, etc.).

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. An apparatus, comprising:
   a controller;
   a plurality of memory devices operably connected to the controller;
   circuitry configured to measure a performance metric for each memory device of the plurality; and circuitry configured to select, based upon the measured performance metric, a subset of the memory devices of the plurality to disable in response to a recovery command.

2. The apparatus of claim 1, further comprising a mode register configured to store information corresponding to the selected subset is stored and readable or writeable, or both, by the apparatus or a host device, or both.

3. The apparatus of claim 1, further comprising circuitry configured, in response to a recovery command, to disable the subset of the plurality of memory devices.

4. The apparatus of claim 3, wherein disabling the subset of the plurality of memory devices includes blowing one or more fuses to disconnect at least a portion of functional circuitry in the subset.

5. The apparatus of claim 4, wherein the portion is exclusive of transmitter and/or receiver circuitry for a device of the subset including through-silicon vias (TSVs) that operably connect two or more of the plurality of memory devices that are not in the subset.

6. The apparatus of claim 1, wherein the subset comprises n−n/x of the plurality of memory devices, where n is a total number of devices in the plurality of memory devices, and x is a power of 2.

7. The apparatus of claim 1, wherein the performance metric is a speed rating, a drive strength, or both.

8. The apparatus of claim 1, further comprising counter logic configured to count a number of oscillations generated by a clock circuit of each of the plurality of memory devices over a predetermined period.

9. The apparatus of claim 1, further comprising circuitry configured to measure the performance metric for the controller.

10. The apparatus of claim 9, further comprising circuitry configured to compare the measured performance metric for each of the plurality of memory devices to the measured performance metric for the controller, and circuitry configured to select the subset based upon the comparing.

11. A method, comprising:
measuring a performance metric for each of a plurality of memory devices;
selecting, based upon the measured performance metric, a subset of the plurality of memory devices to disable in response to a recovery command; and
storing information corresponding to the selected subset is stored in a mode register.

12. The method of claim 11, further comprising disabling, in response to a recovery command, the subset of the plurality of memory devices.

13. The method of claim 12, wherein disabling the subset of the plurality of memory devices includes blowing one or more fuses to disconnect at least a portion of functional circuitry in the subset.

14. The method of claim 13, wherein the portion is exclusive of transmitter and/or receiver circuitry for a device of the subset including through-silicon vias (TSVs) that operably connect two or more of the plurality of memory devices that are not in the subset.

15. The method of claim 11, wherein the subset comprises n−n/x of the plurality of memory devices, where n is a total number of devices in the plurality of memory devices, and x is a power of 2.

16. The method of claim 11, wherein the performance metric is one of a speed or a drive strength.

17. The method of claim 11, wherein measuring the performance metric comprises counting a number of oscillations generated by a clock circuit of each of the plurality of memory devices over a predetermined period.

18. The method of claim 11, further comprising measuring the performance metric for a controller operably coupled to the plurality of memory devices.

19. The method of claim 18, wherein selecting the subset comprises comparing the measured performance metric for each of the plurality of memory devices to the measured performance metric for the controller, and wherein selecting the subset is at least partially based upon the comparing.

20. An apparatus, comprising:
a logic device; and
a plurality of memory devices operably connected to the controller;
wherein the controller is configured, prior to receiving a recovery command, to measure a performance metric for each of the plurality of memory devices and to select, based upon the measured performance metric, a subset of the plurality of memory devices to disable in response to the recovery command.

* * * * *